United States Patent
Carter et al.

(10) Patent No.: US 8,532,165 B2
(45) Date of Patent: Sep. 10, 2013

(54) INDICATING AND DETECTING THE START OF SIGNAL TRANSMISSION EMPLOYING FREQUENCY DIVISION MULTIPLEXING

(75) Inventors: Richard H Carter, Aberdeen (GB); Mark Hathaway, Canterbury (GB)

(73) Assignee: Aker Subsea Limited, Maidenhead, Berkshire (GB)

( * ) Notice: Subject to any disclaimer, the term of this patent is extended or adjusted under 35 U.S.C. 154(b) by 822 days.

(21) Appl. No.: 12/595,913

(22) PCT Filed: Feb. 12, 2008

(86) PCT No.: PCT/GB2008/000461
§ 371 (c)(1),
(2), (4) Date: Apr. 8, 2010

(87) PCT Pub. No.: WO2008/125793
PCT Pub. Date: Oct. 23, 2008

(65) Prior Publication Data
US 2010/0220773 A1 Sep. 2, 2010

(30) Foreign Application Priority Data
Apr. 17, 2007 (GB) .................................. 0707334.9

(51) Int. Cl.
*H04B 1/38* (2006.01)
(52) U.S. Cl.
USPC ............ 375/222; 375/257; 370/203; 370/208
(58) Field of Classification Search
USPC .......................................... 375/260, 257, 222
See application file for complete search history.

(56) References Cited

U.S. PATENT DOCUMENTS

| | | | |
|---|---|---|---|
| 6,944,119 B1 | 9/2005 | Sudo et al. | |
| 6,970,416 B1* | 11/2005 | McGibney | 370/203 |
| 6,993,084 B1 | 1/2006 | Eberlein et al. | |
| 2006/0039270 A1 | 2/2006 | Strohmer et al. | |
| 2010/0202541 A1* | 8/2010 | Carter et al. | 375/257 |

OTHER PUBLICATIONS

International Search Report for PCT/GB2008/000461, mailed Jul. 25, 2008.
Written Opinion of the International Searching Authority for PCT/GB2008/000461 mailed Jul. 25, 2008.
Warner W. D. et al., "OFDM/FM Frame Synchronization for Mobile Radio Data Communication", IEEE Transactions on Vehicular Technology, vol. 42, No. 3, (Aug. 1, 1993), pp. 302-313.
Hans, G. et al., "Advances in Gabor Analysis", Birkhauser, (Jan. 1, 2002), Chapter 12, Subsection 5.3.
Beaver S et al, "Optimal OFDM Design for Time-Frequency Dispersive Channels", IEEE Transactions on Communications, vol. 51, No. 7, (Jul. 1, 2003), pp. 1111-1122.
Hazy L et al., "Synchronization of OFDM Systems Over Frequency Selective Fading Channels", Proceedings of the IEEE Vehicular Technology Conference, vol. 3, (May 4, 1997), pp. 2094-2098.

* cited by examiner

*Primary Examiner* — Eva Puente
(74) *Attorney, Agent, or Firm* — Nixon & Vanderhye PC

(57) ABSTRACT

A modem for use with a subsea transmission line comprises a digital signal processor responsive to a succession of segments of a data signal to produce a respective set of orthogonal frequency division multiplexed signals and to transmit those signals as a burst on the transmission line, and to prepend the burst with a start signal comprising a cyclically time-varying signal envelope-modulated with a Gaussian waveform. The modem is also arranged to convert signals received from the transmission line into a succession of digital samples and to process those samples to obtain an indication of the peak of the Gaussian waveform whereby to provide a datum for decoding a received burst of OFDM signals.

15 Claims, 6 Drawing Sheets

INDICATING AND DETECTING THE START OF SIGNAL TRANSMISSION EMPLOYING FREQUENCY DIVISION MULTIPLEXING

This application is the U.S. national phase of International Application No. PCT/GB2008/000461, filed 12 Feb. 2008, which designated the U.S. and claims priority to GB Application No. 0707334.9, filed 17 Mar. 2007, the entire contents of each of which are hereby incorporated by reference.

BACKGROUND

1. Technical Field

This invention relates to the transmission of information employing a burst of multiple frequency signals such as for example in orthogonal frequency division multiplexing (OFDM). It particularly though not necessarily exclusively relates to the performance of OFDM by a modem intended for subsea communication, such as by means of an umbilical including a transmission line, which may be of significant length.

2. Related Art

Although transmissions of this kind, particularly OFDM, have become popular in a variety of contexts, particularly wireless networks, a problem exists for the reliable acquisition and decoding of the transmitted signal. In particular, in view of the broadband structure of the burst, it is difficult to determine precisely the start of a burst.

If a start signal can be reliably determined to provide an accurate datum, then the burst may commence a predetermined time interval after the datum so as to allow appropriate synchronization of the receiver. A significant problem, particularly for subsea communications, is posed by the impulse response of the transmission line and the dispersion of the components of a start signal. For example, a start signal composed of a short pulse is simply represented in the time domain but in the frequency domain has a substantial spectrum which can be come seriously distorted by transmission along an umbilical of substantial length. The problem is accentuated if the transmission line is constituted by power lines on which the relatively high frequency signals are imposed in addition to the electrical power signals carried by the power lines.

The state of the art in relation to synchronization of OFDM systems (particularly in relation to wireless broadcast systems) is represented by US-6993084-B1, WO99/5366-A1 and IEEE 47$^{th}$ Vehicular Technology Conference, May 1997 pages 2094-2098 (Hazy et al), 'Synchronization of OFDM systems over frequency selective fading channels'.

BRIEF SUMMARY

As indicated previously, the present exemplary embodiment is concerned with an improved technique for indicating and detecting the start of a multiple frequency burst. In its preferred form, the exemplary embodiment provides a start signal which comprises a multiplicity of cycles of a cyclically time-varying signal, preferably a sinusoid, modulated with a substantially Gaussian envelope. The use of such an envelope reduces the effect of impulse response on the subsequent signal and by virtue of its shape is well adapted to provide an indication of a datum for the synchronization of a receiver. The start of the coded burst can be a predetermined time after the datum defined by the Gaussian envelope.

A receiver may monitor the power of an incoming signal over, for example, a cycle of the cyclically time varying signal. The receiver can detect an increase of the received power and, more particularly, may detect a subsequent decrease, corresponding to passage through the maximum of the Gaussian envelope. The receiver may use that as a reference point in the time domain.

In a preferred system, a data stream is converted by means of an appropriate transform, such as an inverse fast Fourier transform (FFT) into, for each segment of the data signal, a set of modulated carriers of which the spectra overlap but which are chosen so that they are orthogonal and therefore, despite the overlap, do not significantly mutually interfere. As will be described with reference to a particular example later, each transmission cycle preferably comprises a set of carriers each of which has an amplitude and phase determined by a complex number itself determined in accordance with a respective segment of the data stream. The inverse FFT converts the complex number into a time domain signal. In a preferred example, four bits of the digitized signal may determine the phase of the relevant carrier and two bits may determine the amplitude. On reception, the time domain signals in the set may be sampled and reconverted by means of a fast Fourier transform to recover the original data stream.

There follows a detailed description of an embodiment of the invention as constituted within a subsea communication system and particularly within modems for communicating by means of an umbilical.

DETAILED DESCRIPTION OF EXEMPLARY EMBODIMENTS

Figure 1:
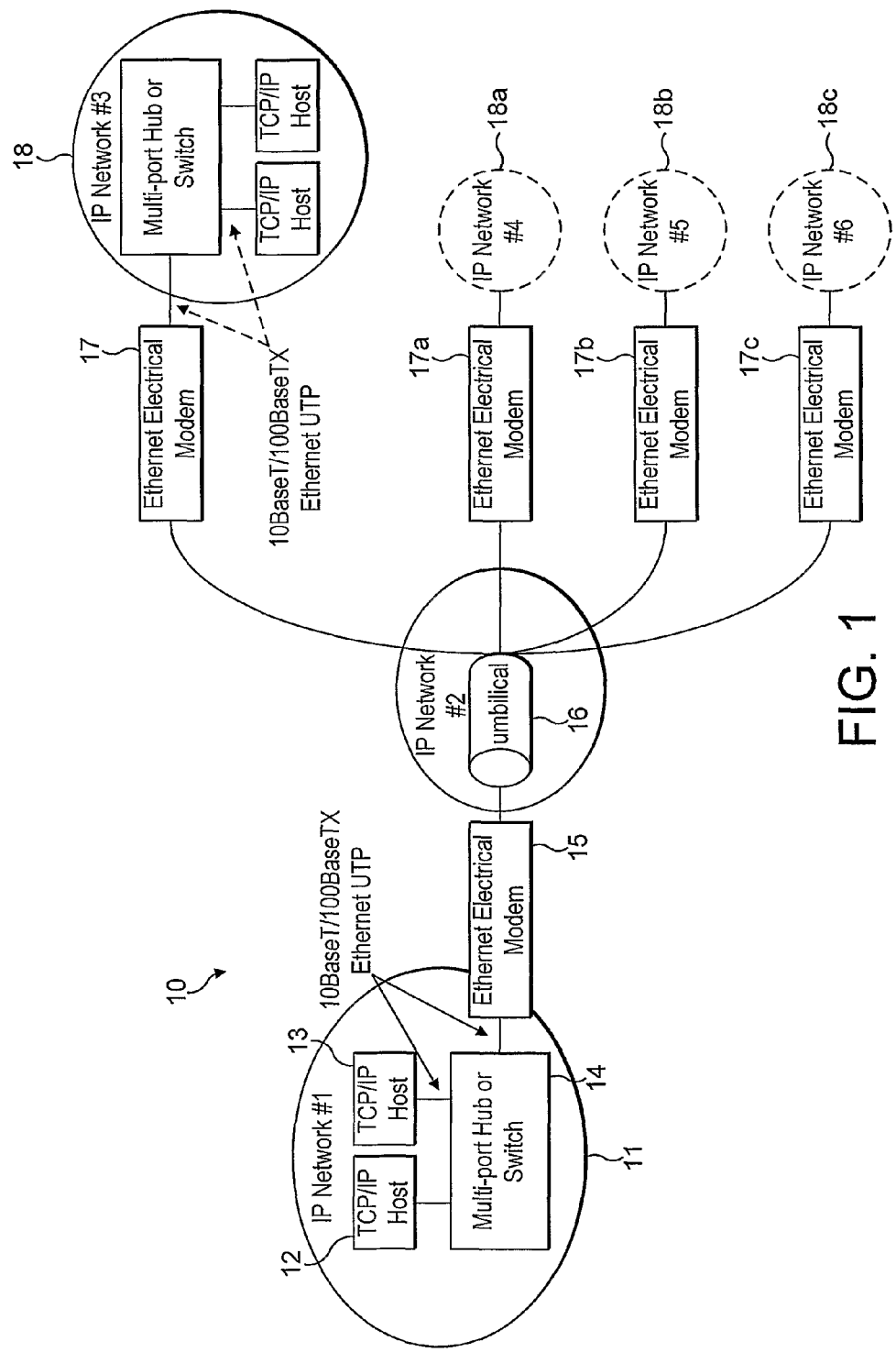
FIG. 1 is a schematic diagram of a subsea communication system.

FIG. 1 of the drawings shows by way of example a subsea communication system 10. The reference 11 denotes a subsea control unit which may contain within it TCP/IP hosts 12 and 13, and a multi-port hub or switch 14. The subsea control unit 11 has, for communicating with other units, a modem 15, particularly an Ethernet modem coupled, as hereinafter described, to an umbilical 16 which extends from the control unit 11 to the locations of subsea electronics modules. Very typically, the umbilical may be of very substantial length, such as tens of kilometers.

Reference 18 denotes schematically a subsea electronics module which may include TCP/IP hosts and a multi-port hub or switch as well as a modem 17 for communicating with other units by way of the umbilical 16. Other subsea electronics modules are denoted by the references 18a, 18b and 18c with their respective modems 17a, 17b and 17c.

Such a system provides the ability to connect TCP/IP-enabled hosts together and to allow them to communicate over long distances. The reference to the particular transmission protocol (TCP) and the addressing or network layer protocol (internet protocol) is given by way of example. The invention is not limited to such protocols.

Figure 2:
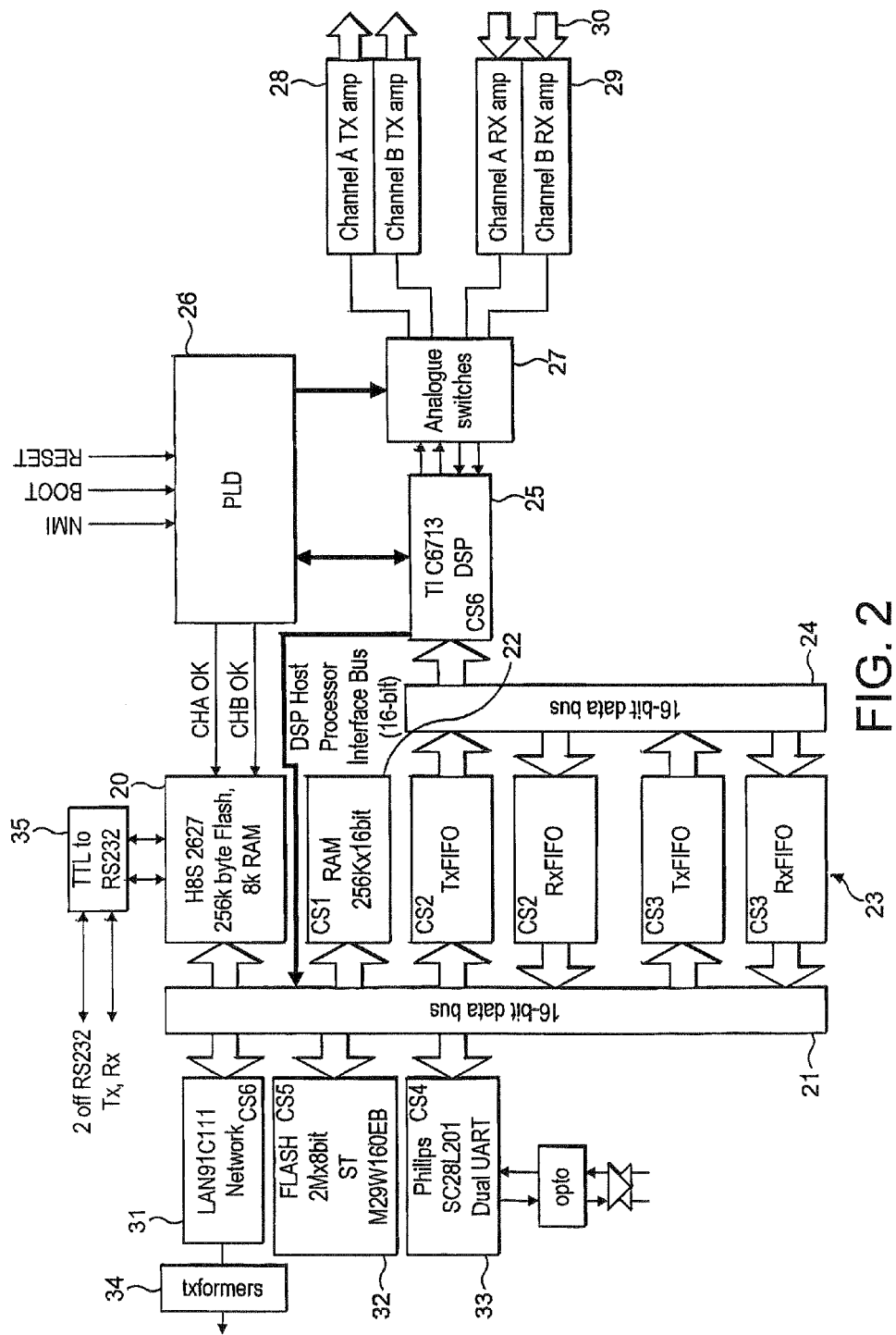
FIG. 2 is a schematic diagram of a modem for use in the system shown in FIG. 1.

FIG. 2 illustrates one of the modems which may be used in FIG. 1. In essence this modem will, for transmission, take a digital data stream and convert it into successive bursts of modulated carrier signals, preferably by means of OFDM bursts preceded by a start signal; on reception they will detect OFDM bursts employing a start signal as hereinafter described and apply transforms to reconvert the received signals back to a digital data stream.

The particular organization of the modem is not important. The modem shown in FIG. 2 is expected to perform the routing of internet protocol packets between its network interfaces.

The modem in this example comprises a microcontroller 20 (for example type H8S 2628 with 256K flash memory and 8K random access memory) which can communicate by way of a 16-bit data bus 21 with random access memory 22 as well as transmit and receive FIFOs 23 themselves coupled by way of a 16-bit data bus 24 to a digital signal processor (DSP) 25. This is coupled to a programmable logic device (PLD) 26 as well as analogue switches 27 that provide coupling to transmit-channel amplifiers 28 and receive channel amplifiers 29 coupled to an umbilical 30. The switches 27 and the amplifiers 28 and 29 have been shown schematically in FIG. 2; they are described in detail in FIG. 3.

The DSP 25 has an interface with the data bus 21. Coupled to the data bus 21 are a LAN interface 31, flash memory 32 and a UART 33. The LAN interface has coupling transformers 34. The microcontroller 20 also has a RS232 interface 35.

The primary interface is the LAN interface 31 which is software configured in any desired manner to auto detect the speed of the connected network and whether it is full or half duplex. The microcontroller 20 is expected to implement a half-duplex logical bus topology and a data link protocol to carry the internet protocol packets on the umbilical.

When the microcontroller has a packet to transmit on an umbilical channel it writes data to a transmit FIFO 23, one word at a time. It then signals to the digital signal processor 25 that there is data to transmit. The digital signal processor 25 will receive the microcontroller's start signal as an external interrupt, indicating that a packet is in the transmit FIFO waiting to be transmitted. The digital signal processor 25 reads the packet data a word at a time from the transmit FIFO into an internal random access memory until it sees a flag denoting that the FIFO is empty. The digital signal processor 25 encodes the packet data into a digitized analogue signal to transmit onto the umbilical. It writes the signal by means of a serial interface to the relevant channel of a codec (omitted for simplicity from FIG. 2) to transmit the data.

In this example, the various elements on the system may be arranged in a token bus topology but such is not essential to the present exemplary embodiments.

In this example, the various elements on the system may be arranged in a token bus topology but such is not essential to the present invention.

The digital signal processor 25 constantly reads data from both channels of the codec looking for a start symbol. It then determines, as will be described later, where the start of the encoded packet will begin.

Raw samples are loaded into internal random access memory and decoding is performed to reproduce a data packet. When the complete data packet has been recreated, the digital signal processor 25 writes it one word at a time into the receive FIFO for that channel. The digital signal processor 25 then clears the relevant receive FIFO bit.

Figure 3:
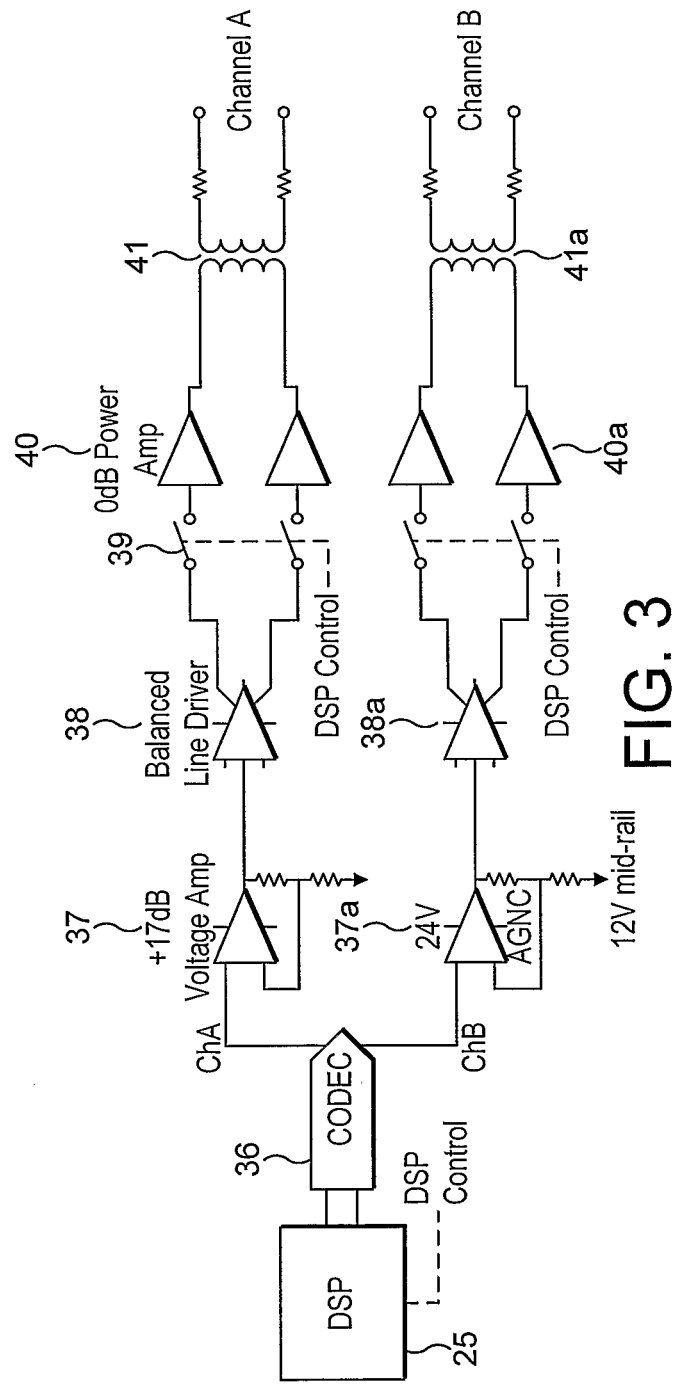
FIG. 3 is a schematic diagram of a transmit channel.

FIG. 3 illustrates a transmit channel. The digital signal processor 25 controls a codec (coder/decoder) 36 which drives two redundant transmit channels A and B. The upper channel in the drawing includes an amplifier 37, a balanced line driver 38, switches 39 controlled by the digital signal processor (and corresponding to the switches 27 in FIG. 2), power amplifiers 40 and an output transformer 41. The same components in the lower channel B are denoted (a).

Figure 4:
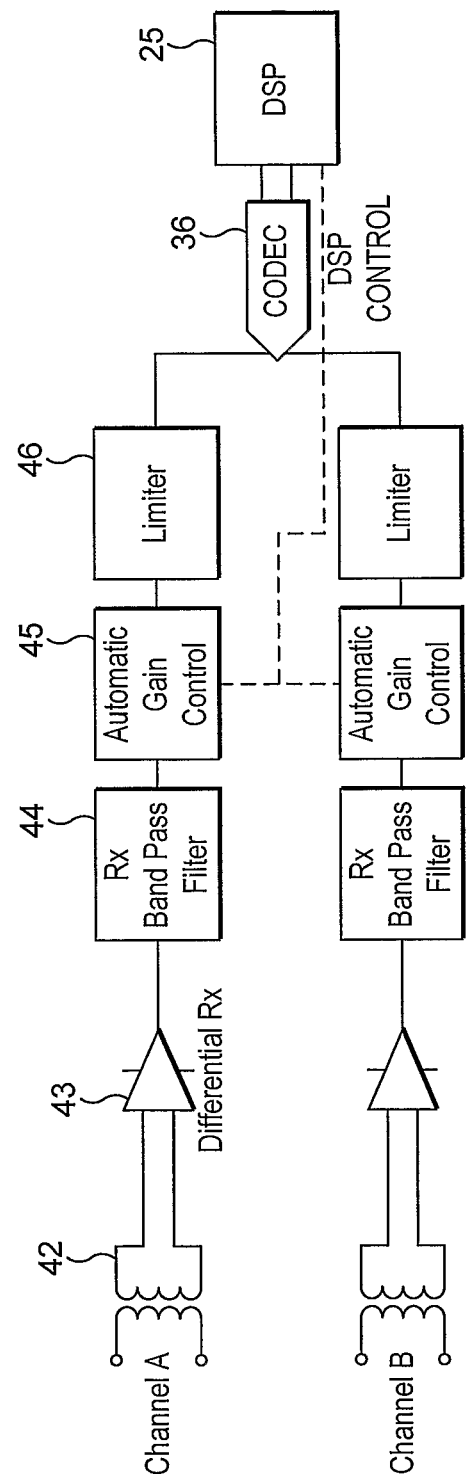
FIG. 4 is a schematic diagram of a receive channel.

Each receive channel (FIG. 4) comprises a transformer 42, a differential amplifier 43, a band-pass filter 44, an automatic gain control circuit 45, and a limiter 46 coupled to the codec 36. The lower (redundant) channel corresponds.

Figure 5:
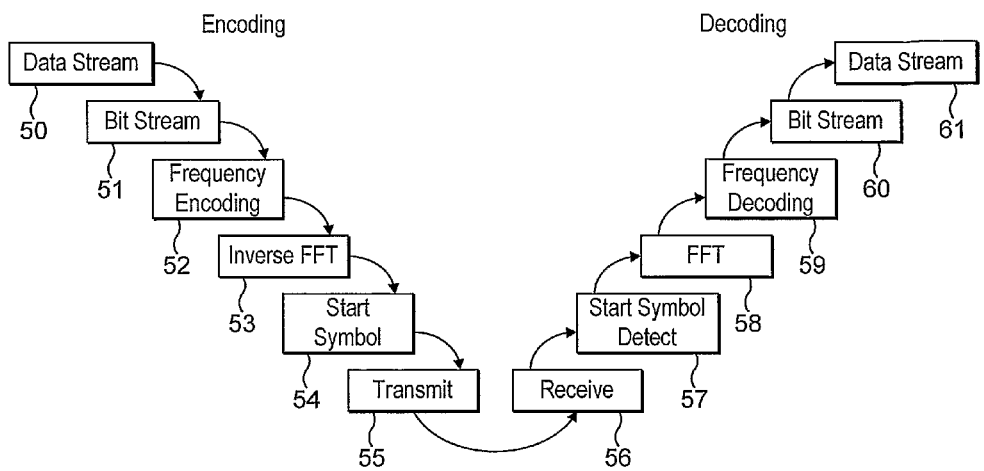
FIG. 5 is a schematic diagram of a transmit and receive process.

FIG. 5 illustrates the process of encoding and decoding a data stream. The transmitter and receiver in this example employ orthogonal frequency division multiplex to transmit data as a fixed length signal composed of multiple frequencies, each of which carry some data components.

This form of system is intended to provide reliable communication over possibly long distances, with high data rates and substantial immunity to noise. The system is intended to be either point-to-point or multi-drop but is not necessarily intended to provide any mechanism for media access control and assumes a shared bandwidth across all nodes.

As is shown in FIG. 5, the modulation process starts with a data steam 50 which is converted into a bit stream 51. The bit stream format depends upon the number of bits to be used in each of the amplitude and phase. For each of the available frequencies, the amplitude and phase is set based on the data in the bit stream. Segments of the bit stream are encoded as complex numbers and are encoded (stage 52) by means of an inverse fast Fourier transform (53) into a burst of sinusoids of orthogonal frequencies with amplitudes and phase determined by the respective complex number. The OFDM burst is appended to a start signal, stage 54, and the resultant is transmitted, stage 55. The demodulation process comprises reception 56, the detection 57 of a start symbol, the application of a fast Fourier transform 58, frequency decoding 59 and conversion to a bit stream 60 and finally conversion to the original data stream 61.

For maximum power transfer to occur when a modem is communicating, the modem line driver output impedance and the receiver input impedance should preferably be matched to that of the umbilical, which is approximately 100 ohms. The input impedance of the receiver is just that of the transmitter since they are shorted together. Therefore, to ensure that the channel receiver has the correct impedance the transmit amplifier should be enabled at all times. Otherwise, the receiver would be in a higher impedance state owing to the amplifiers' reflective impedance. In order to prevent unwanted circuit noise from being amplified and causing interference with the receiver, the ability to ground these amplifiers' inputs is provided by way of a switch.

The digital signal processor 25 generates in memory a signal consisting of samples that the codec can output. Each sample is in the approximate range −32760 to +32760. The digital signal processor 25 first generates the start symbol and then generates a number of signal 'bursts' (to the length of the FFT) which contain the coded data. Once sufficient bursts have been generated to transmit the data packet to be sent, the codec is instructed to begin transmitting the signal. The codec may employ DMA (direct memory access) to read the memory of the digital signal processor 25 across the interconnecting serial link and outputs the signal to the analog output stages. The generated signal is then transmitted.

The decoding requires the receiver to be constantly examining the transmission line for a new signal. A signal starts with a start symbol which is a number of cycles of a known frequency with a Gaussian distribution amplitude envelope applied to it.

Each transmission burst being of a known, fixed length, the receiver can read in the correct number of samples after the start symbol. An FFT (fast Fourier transform) is performed on the samples to determine the amplitude and phase of each of the frequencies within the signal. The receiver knows how many bits per phase and amplitude to expect in each frequency and begins to decode the signal.

Figure 6:
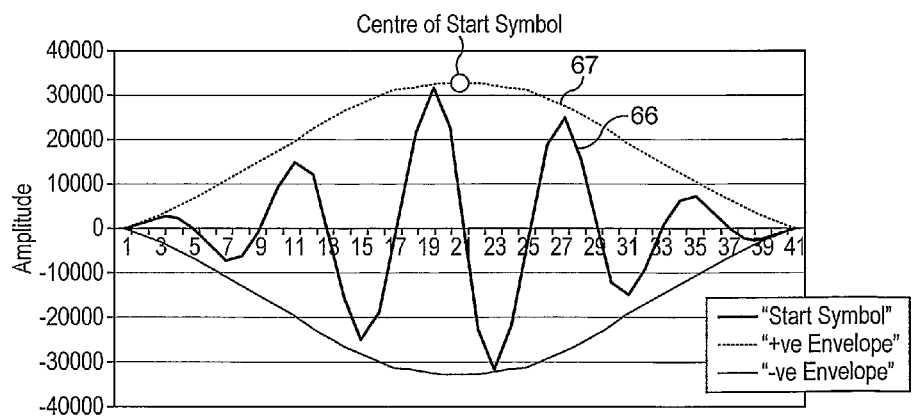
FIG. 6 is a graph illustrating a start signal.

In order to allow the synchronization of the receiver with the transmitter, the transmitter broadcasts, as noted earlier, a start symbol. One example of the start symbol 66 is shown in FIG. 6. It comprises a succession of cycles of a cyclically time-varying signal, preferably a pure sinusoid, modulated with a substantially Gaussian envelope 67, i.e. the shape of a Gaussian probability distribution. The use of a Gaussian envelope reduces the effect of impulse response on the subsequent signal and therefore provides the receiver with an accurate datum for synchronization. As previously indicated, the receiver continuously measures the power of the incoming signal over the period of the sine wave. If the power is greater than a given threshold, the receiver can determine that a signal has been transmitted. The receiver can detect the increase in power of the start signal and more importantly detect when the signal decreases. This is the 'center' of the start symbol shown in FIG. 6. Thus, the receiver can find the center point of the start symbol and employ that as a reference point in the time domain.

Figure 7:
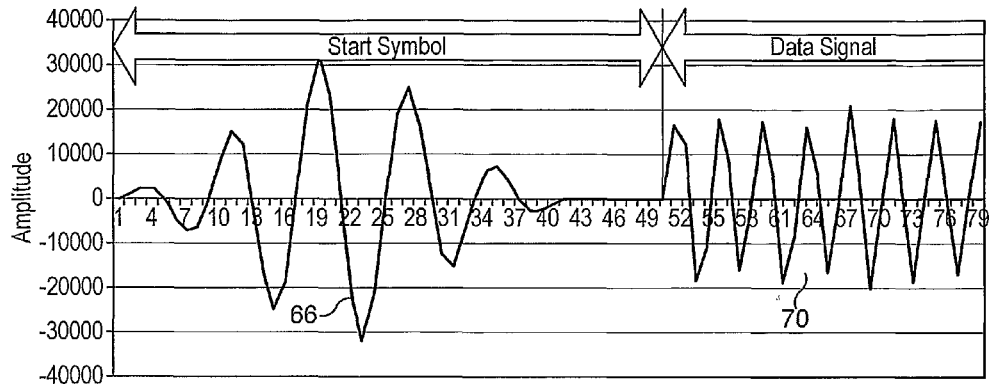
FIG. 7 is a graph illustrating a relationship between the start signal and a subsequent OFDM burst.

FIG. 7 illustrates the relationship between the start symbol 66 and the data signals 70, in the embodiment a burst of OFDM signals. The start symbol is prepended to the data signal so that there is a predetermined time between the maximum of the Gaussian envelope and the commencement of the OFDM burst. In this embodiment, the start symbol serves two purposes. One is to facilitate the synchronization of the receiver. Another is to facilitate automatic gain control by allowing the detection of peak power in the start symbol.

Figure 8:
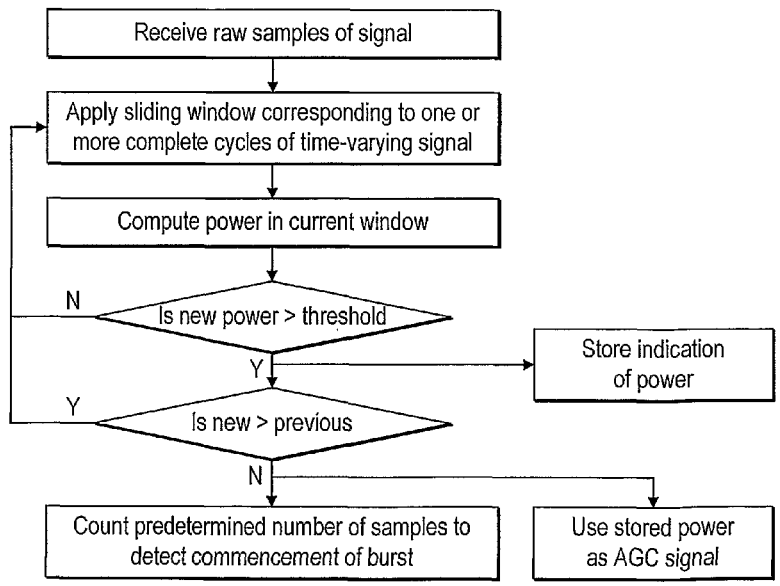
FIG. 8 is a diagram illustrating the detection of the start symbol.

FIG. 8 illustrates the method of detecting the start symbol.

The modem continuously monitors the receiving channels and for each channel samples the received signal level. It applies to the raw samples, which are stored in internal RAM, a sliding or progressive window corresponding to the duration of (in one example) one cycle of the time-varying signal that forms the start symbol. As the window includes each fresh sample the power in the samples within the window is computed (e.g. by computing the sum of the squares of the samples in the window). If the integrated power exceeds a threshold (set above the expected noise level) it is set as a current reference. The corresponding integrated power for the samples taken during the next cycle is compared with the current reference. If it exceeds the reference the process is repeated until the measured power in a cycle is less than the current reference. This identifies a datum corresponding to the cycle of maximum power. The start of the data signal (i.e. the OFDM burst) is determined by counting a predetermined number of cycles on from this datum.

At the same time the maximum value of the reference is used to provide an automatic gain control signal to the respective automatic gain control circuit 45.

In a practical example, the start symbol comprises 5 cycles of a 3 kHz sinusoid. The sample rate is 50 kHz. It is not necessary to employ a window of a single cycle. For example the start symbol may comprise 15 cycles of a 10 kHz sinusoid and the window may comprise samples spanning three cycles of the sinusoid. In both cases the 'spread' of the envelope is approximately 1.5 ms.

The highest frequencies employed for the OFDM burst are limited by the attenuation of the transmission line, higher frequencies being attenuated more than lower frequencies, and by the Nyquist limit, i.e. half the sampling rate. The lower frequencies are limited by the coupling transformers which provide the coupling to the umbilical and/or by low frequency noise generated by power supplies (which may be used as a transmission medium). In practice the lowest usable frequency is above 2.5 kHz.

Since the highest frequencies are expected to be attenuated the most, due to the transmission line, it is preferable to choose the lowest useable frequency for the start symbol. If the start symbol can be detected, the gain may be adjusted to obtain information from all the frequencies which, without gain, cannot be recovered. On the same assumption, the low frequencies should have the greatest amplitudes at the receiver, so if the gain is adjusted to cope with those frequencies without overdriving, accidental overdriving at any other frequency, and consequential signal loss, can be avoided.

The invention claimed is:

1. A method of transmitting information on a transmission line comprising:
    configuring and operating at least one digital signal processor to transmit information on a transmission line as components of a burst of carriers of different frequencies,
    wherein the burst is preceded by a start symbol signal in predetermined timing relationship with the burst and said start symbol signal comprises a cyclically time-varying signal envelope-modulated with a substantially Gaussian waveform.

2. A method according to claim 1 in which the burst is a set of OFDM signals.

3. A method according to claim 1 in which the cyclically time-varying signal is a single sinusoid.

4. A method of detecting, in a signal received from a transmission line, a burst of information-bearing carrier signals of different frequencies, wherein the burst is preceded in predetermined temporal relationship by a start symbol comprising plural cycles of a cyclically time-varying signal envelope-modulated with a substantially Gaussian waveform, said method comprising:
    repetitively sampling said received signal from a transmission line including a burst of information-bearing carrier signals of different frequencies to provide a succession of samples;
    computing for successive intervals, each interval corresponding to an integral number of cycles of the cyclically time-varying signal, power in said received signal; and
    determining if the computed power for a particular interval is above a threshold and is less than the computed power for an immediately previous interval.

5. A method according to claim 4 in which integral the number of cycles is unity.

6. A method according to claim 4 in which the burst is a set of OFDM signals.

7. A method according to claim 4 in which the cyclically time-varying signal is a single sinusoid.

8. A modem for use with a subsea transmission line, said modem comprising:
    input and output circuits coupled to a digital signal processor organized to respond to a succession of segments of a data signal to (a) produce a respective set of orthogonal frequency division multiplexed signals, (b) transmit those signals as a burst on the subsea transmission line, and (c) prepend the burst with a start signal comprising a cyclically time-varying signal envelope modulated with a Gaussian waveform.

9. A modem for detecting in a signal received from a transmission tine a burst of information-bearing carrier signals of different frequencies, in which the burst is preceded in predetermined temporal relationship by a start symbol comprising plurality of cycles of a cyclically time-varying signal envelope-modulated with a substantially Gaussian waveform, the modem comprising:
- means for repetitively sampling said received signal from a transmission line to provide a succession of samples;
- means for computing for successive intervals, each interval corresponding to an integral number of cycles of the cyclically time-varying signal, power in said received signal; and
- means for determining if the computed power for a particular interval is above a threshold and is less than the computed power for an immediately previous interval.

10. A modem according to claim 9 in which the integral number of cycles is unity.

11. A modem according to claim 10 in which the means for computing and determining is a digital signal processor.

12. A modem according to claim 8, further comprising a digital signal processor and circuit controlled thereby configured to:
- (a) repetitively sample a received signal from a transmission line to provide a succession of samples;
- (b) compute for successive intervals, each interval corresponding to an integral number of cycles of the cyclically time-varying signal, the power in said received signal; and
- (c) determine if the computed power for a particular interval is above a threshold and is less than the computed power for an immediately previous interval.

13. A method of detecting according to claim 4, in combination with a method for coding information to be transmitted on a transmission line as components of a burst of carriers of different frequencies, wherein the burst is preceded by a start symbol in predetermined timing relationship with the burst and comprising a cyclically time-varying signal envelope-modulated with a substantially Gaussian waveform.

14. A method of communicating information on a subsea transmission line, said method comprising:
- generating an information-bearing signal including components of a burst of carriers of different frequencies;
- generating a start symbol preceding said burst and in predetermined timing relationship with the burst, said start symbol including a cyclically time-varying signal envelope-modulated with a substantially Gaussian waveform;
- transmitting said information-bearing signal preceded by said start symbol on a subsea transmission line;
- receiving said cyclically time-varying signal and said information-bearing signal from said subsea transmission line; and
- determining the occurrence of a maximum value of said cyclically time-varying signal to provide a datum for decoding said burst.

15. The method of claim 14, wherein the determining step comprises:
- computing for successive intervals, each interval corresponding to an integral number of cycles of said cyclically time-varying signal, power in said cyclically time-varying signal; and
- determining if the computed power for a particular one of said successive intervals is above a threshold and is less than the computed power for an immediately previous one of said successive intervals.

* * * * *